US012574003B1

(12) United States Patent
Sugimori

(10) Patent No.: US 12,574,003 B1
(45) Date of Patent: Mar. 10, 2026

(54) ELASTIC WAVE DEVICE, METHOD FOR MANUFACTURING ELASTIC WAVE DEVICE, BRANCHING FILTER AND COMMUNICATION DEVICE

(71) Applicant: KYOCERA CORPORATION, Kyoto (JP)

(72) Inventor: Tatsuya Sugimori, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 19/044,164

(22) Filed: Feb. 3, 2025

Related U.S. Application Data

(63) Continuation of application No. PCT/JP2024/044793, filed on Dec. 18, 2024.

(30) Foreign Application Priority Data

Oct. 4, 2024    (JP) ................................ 2024-175170

(51) Int. Cl.
| | |
|---|---|
| *H03H 9/02* | (2006.01) |
| *H03H 3/08* | (2006.01) |
| *H03H 9/145* | (2006.01) |
| *H03H 9/25* | (2006.01) |
| *H03H 9/72* | (2006.01) |

(52) U.S. Cl.
CPC .......... *H03H 9/02842* (2013.01); *H03H 3/08* (2013.01); *H03H 9/02574* (2013.01); *H03H 9/145* (2013.01); *H03H 9/25* (2013.01); *H03H 9/725* (2013.01)

(58) Field of Classification Search
CPC ........... H03H 9/02842; H03H 9/02574; H03H 9/145; H03H 9/25

USPC ...... 310/313 R, 313 A, 313 B, 313 C, 313 D
See application file for complete search history.

(56) References Cited

U.S. PATENT DOCUMENTS

| | | | | |
|---|---|---|---|---|
| 5,568,001 | A | * 10/1996 | Davenport | ......... H03H 9/14538 |
| | | | | 310/313 R |
| 2001/0022544 | A1 | * 9/2001 | Endoh | .................... H03H 9/008 |
| | | | | 333/195 |

(Continued)

FOREIGN PATENT DOCUMENTS

| | | |
|---|---|---|
| JP | 08-181561 A | 7/1996 |
| JP | 2000-106519 A | 4/2000 |

(Continued)

*Primary Examiner* — Derek J Rosenau
(74) *Attorney, Agent, or Firm* — Volpe Koenig

(57)    ABSTRACT

An elastic wave device includes a substrate having an end surface and including a piezoelectric body, and strip electrodes located above the substrate, each of the strip electrodes extending in parallel. Some of the strip electrodes are excitation portions that can excite an elastic wave, the end surface is parallel to the direction the strip electrodes extend, and located in an elastic wave propagation direction. The plurality electrodes include a first strip electrode located closest to the end surface in the elastic wave propagation direction, and a second strip electrode farther from the end surface than the first strip electrode in the elastic wave propagation direction, the second strip electrode is the excitation portion, and an average thickness of the first strip electrode is smaller than an average thickness of the second strip electrode, in a cross section cut in the elastic wave propagation direction.

17 Claims, 12 Drawing Sheets

(56)    References Cited

U.S. PATENT DOCUMENTS

2004/0070313  A1*   4/2004   Furukawa ..........  H03H 9/14541
                                                    310/313 R
2013/0335170  A1   12/2013   Ikuta et al.
2016/0182009  A1*   6/2016   Bhattacharjee  ....  H03H 9/02574
                                                    310/313 R
2019/0238114  A1    8/2019   Kishimoto et al.
2021/0098683  A1    4/2021   Iwabuchi et al.

FOREIGN PATENT DOCUMENTS

JP        2019-213042  A    12/2019
JP        2021-052359  A     4/2021
JP        2023-141885  A    10/2023
WO        2012/102131  A1    8/2012
WO        2018-096783  A1    5/2018

* cited by examiner

ELASTIC WAVE DEVICE, METHOD FOR MANUFACTURING ELASTIC WAVE DEVICE, BRANCHING FILTER AND COMMUNICATION DEVICE

TECHNICAL FIELD

The present disclosure relates to an elastic wave device using an elastic wave, a method for manufacturing the elastic wave device, a branching filter including the elastic wave device, and a communication device including the branching filter.

BACKGROUND OF INVENTION

An elastic wave device that utilizes an elastic wave is known. The elastic wave device is, for example, a surface acoustic wave (SAW) device. The elastic wave device has a structure that reflects a propagating elastic wave. The surface elastic wave device disclosed in Patent Document 1 is an end surface reflection type surface elastic wave device having an end surface as a reflection structure.

CITATION LIST

Patent Literature

Patent Document 1: WO 2018/096783 A1

SUMMARY

In the present disclosure, an elastic wave device includes a substrate having an end surface and including a piezoelectric body, and a plurality of strip electrodes located above the substrate, each of the plurality of strip electrodes extending in parallel. At least some strip electrodes among the plurality of strip electrodes are each an excitation portion that can excite an elastic wave. In a plan view from above, the end surface is parallel to a direction in which the plurality of strip electrodes extend, and located in an elastic wave propagation direction with respect to the excitation portion. The plurality of strip electrodes include a first strip electrode located closest to the end surface in the elastic wave propagation direction, and a second strip electrode farther from the end surface than the first strip electrode in the elastic wave propagation direction. The second strip electrode is the excitation portion. An average thickness of the first strip electrode is smaller than an average thickness of the second strip electrode, in a cross section cut in the elastic wave propagation direction.

In the present disclosure, an elastic wave device includes a substrate having an end surface and including a piezoelectric body, and a plurality of strip electrodes located above the substrate, each of the plurality of strip electrodes extending in parallel. At least some strip electrodes among the plurality of strip electrodes are each an excitation portion that can excite an elastic wave. In a plan view from above, the end surface is parallel to a direction in which the plurality of strip electrodes extend, and located in an elastic wave propagation direction with respect to the excitation portion. The plurality of strip electrodes include a first strip electrode located closest to the end surface in the elastic wave propagation direction, and a second strip electrode farther from the end surface than the first strip electrode in the elastic wave propagation direction, the second strip electrode being the excitation portion. The first strip electrode has a lower surface, a first surface located on a side of the end surface among side surfaces in contact with the lower surface in the elastic wave propagation direction, an upper surface in contact with the first surface, and a second surface connecting the first surface and the upper surface. The second surface has a curved shape.

In the present disclosure, a method for manufacturing an elastic wave device includes forming a plurality of strip electrodes above a substrate, forming a mask above the plurality of strip electrodes, forming an end surface on the substrate by etching, and removing a portion of a first strip electrode located closest to the end surface in an elastic wave propagation direction among the plurality of strip electrodes by the etching.

DESCRIPTION OF EMBODIMENTS

Figure 1:
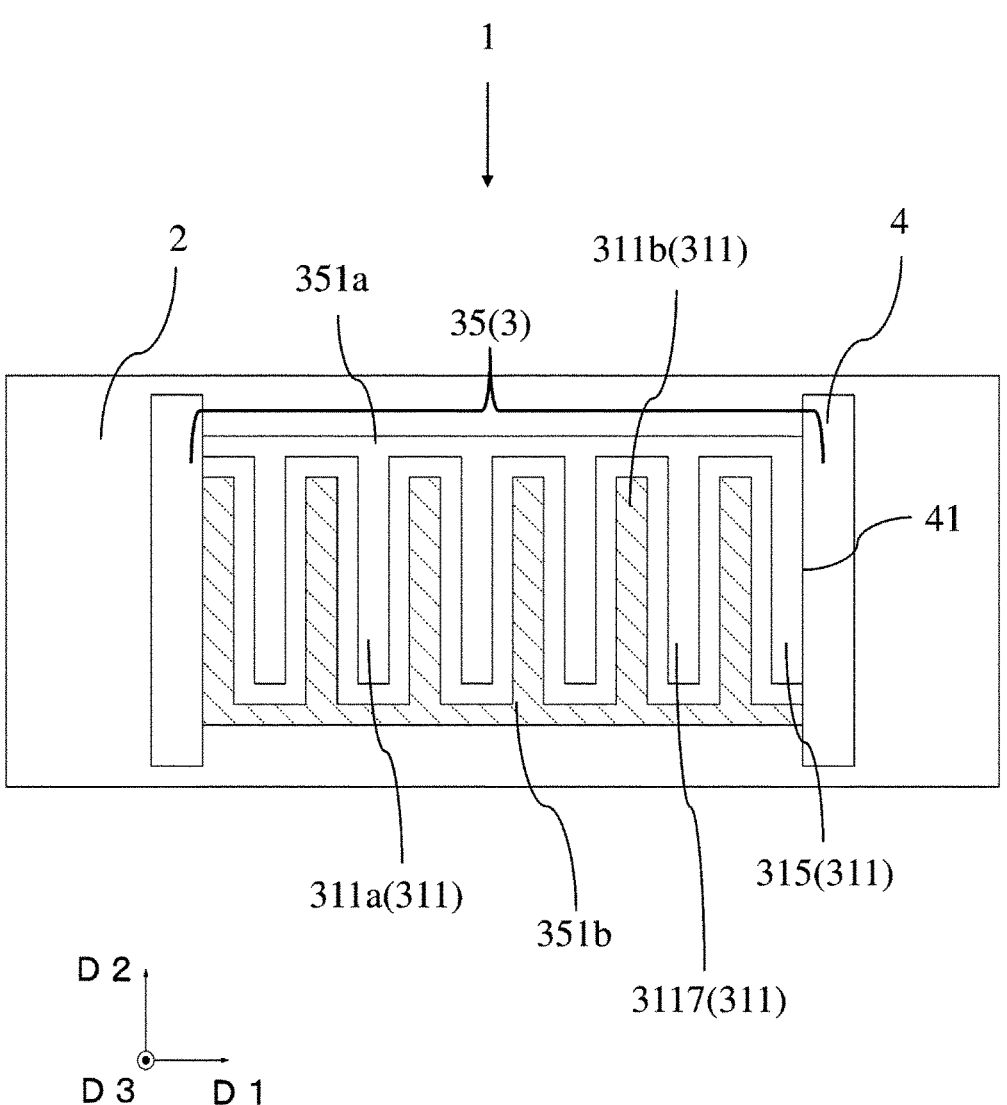
FIG. 1 is a schematic plan view of an elastic wave device according to an embodiment of the present disclosure.

Hereinafter, embodiments and comparative examples according to the present disclosure will be described with reference to the drawings. The drawings used in the following description are schematic, and dimensional ratios and the like in the drawings do not necessarily coincide with actual ones. The dimensional ratios do not match between the drawings.

In the present disclosure, orthogonal coordinate systems indicated by a D1 axis, a D2 axis, and a D3 axis are attached to the drawings. The D2 axis is an axis parallel to a direction in which an excitation portion 311 described below extends from a second bus bar 351b described below. The D1 axis is an axis perpendicular to the D2 axis in a plane of a substrate 2. The D3 axis is an axis perpendicular to the upper surface of a piezoelectric body 21. In other words, the D3 axis is in a stacking direction of the substrate 2. In the present disclosure, a positive direction of the D1 axis is a direction from an excitation portion 311 described below toward one end surface 41 described below. In the present disclosure, the positive direction of the D1 axis is also referred to as an elastic wave propagation direction. In the present disclosure, the negative direction of the D1 axis is also referred to as a direction opposite to the elastic wave propagation direction. The end surface 41 may be located in both directions of the D1 axis with respect to the excitation portion 311, but in the present disclosure, for convenience of description, a direction from the excitation portion 311 toward the one end surface 41 is defined as the elastic wave propagation direction. Here, the elastic wave excited by the excitation portion 311 may be a surface elastic wave or a plate wave. The positive direction of the D2 axis is a direction in which a second excitation portion 311b described below extends from a second bus bar 351b described below. The positive direction of the D3 axis is a direction from the substrate 2, which will be described below, toward an electrode layer 3, which will be described below. The term "plane" or "plan view" refers to a view in the direction of the D3 axis unless otherwise specified. For example, a plan view from above refers to a case where the D3 axis is viewed from above.

In the elastic wave device 1 according to the present disclosure, any direction may be defined as an upward direction or a downward direction, but terms such as an upper surface and a lower surface may be used with a positive direction side of the D3 axis defined as an upward direction for convenience.

In the present disclosure, the thickness of a layer may be mentioned, but unless otherwise specified, the thickness may be considered at the thickest portion or the thinnest portion in any cross section.

Embodiments of the present disclosure will be described below. The configurations described in the following embodiments may be freely combined with other embodiments.

First Embodiment

Figure 2:
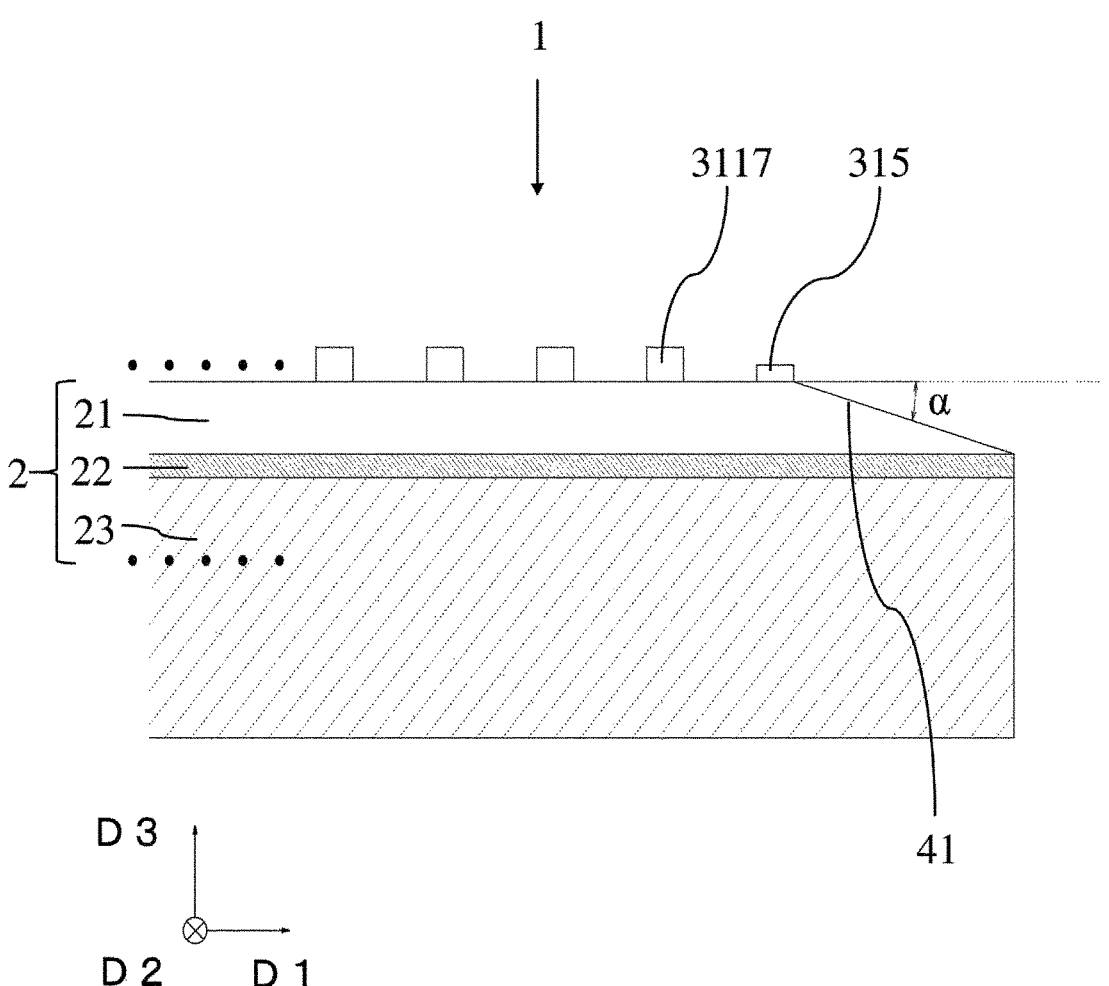
FIG. 2 is a schematic cross-sectional view of the elastic wave device according to an embodiment of the present disclosure.

A first embodiment of an elastic wave device 1 according to the present disclosure will be described. FIG. 1 is a schematic plan view of the elastic wave device 1. The elastic wave device 1 includes a substrate 2, an electrode layer 3 located above the substrate 2, and an end surface 41 included in the substrate 2. FIG. 2 is a schematic cross-sectional view of the elastic wave device 1.

Substrate

The substrate 2 has a piezoelectric body 21. As illustrated in FIG. 2, the substrate 2 may include a first layer 22 and/or a support substrate 23 located below the piezoelectric body 21.

The piezoelectric body 21 is made of a piezoelectric single crystal containing lithium niobate (LiNbO$_3$: hereinafter referred to as LN) or lithium tantalate (LiTaO$_3$: hereinafter referred to as LT). For example, the piezoelectric body 21 may be constituted by a 36 to 54° Y-cut X-propagation LT layer.

Examples of the first layer 22 include silicon dioxide (SiO$_2$). The first layer 22 is able to reduce surface waves that leak below the piezoelectric body 21 and reduce the insertion loss of the elastic wave device 1.

The support substrate 23 supports the electrode layer 3 and the piezoelectric body 21 and improves the strength of the substrate 2. When the support substrate 23 is provided, the first layer 22 improves the bonding strength between the piezoelectric body 21 and the support substrate 23.

End Surface

As illustrated in FIG. 1, the substrate 2 includes an end surface 41. The one end surface 41 is located in the elastic wave propagation direction with respect to an excitation portion 311, which will be described below. The end surface 41 may be located in both directions of the D1 axis with respect to the excitation portion 311. The end surface 41 reflects the elastic wave as a reflected wave toward the negative direction of the D1 axis. In other words, the end surface 41 is a reflective structure.

The end surface 41 may be a portion of a groove portion 4. Specifically, as illustrated in FIG. 1, a portion of the side surface of the groove portion 4 may be the end surface 41. In this case, the side surfaces on both sides of the groove portion 4 can be used as the end surfaces 41.

In a plan view, the end surface 41 is located parallel to the direction in which a strip electrode 31 extends. Here, "parallel" may include an error within a range that does not significantly affect specific characteristics of the elastic wave device 1.

In the present disclosure, an "end surface" is defined as a surface that reflects an elastic wave. For example, the end surface may be a surface of an end of the substrate or an inner wall surface of a groove portion of the substrate.

Electrode Layer

The electrode layer 3 is formed so as to be in direct or indirect contact with the upper surface of the piezoelectric body 21. Although not particularly illustrated, an underlayer may be located between the electrode layer 3 and the piezoelectric body 21. The base layer can improve the adhesive strength between the electrode layer 3 and the piezoelectric body 21. Examples of the material of the underlayer include titanium (Ti), chromium (Cr), and various dielectrics.

The electrode layer 3 is made of a material having conductivity. As a material of the electrode layer 3, for example, various conductive materials such as aluminum (Al), copper (Cu), platinum (Pt), molybdenum (Mo), gold (Au), titanium (Ti), or alloys thereof can be adopted. Further, a plurality of these layers may be layered. Although not illustrated, the electrode layer 3 may have a layered structure in which the above-described materials are combined. For example, a layered structure of Al and CuAl$_2$ or a layered structure of Al and Ti may be employed. The etching selectivity of LT to Al is lower than the etching selectivity of LT to Pt, Mo, Au or Ti. Therefore, in a case where the electrode layer 3 containing Al as a main component is used, the electrode layer 3 is likely to be thinned by etching, and thus a first strip electrode 315 described below is likely to be formed. In the present disclosure, a substance occupying the largest proportion in weight ratio or molar ratio may be a main component, or a substance occupying a half or more may be a main component. In a cross section cut in the elastic wave propagation direction, a material occupying the largest proportion of the entire thickness in the D3 axis may be used, or a material occupying half or more of the entire thickness may be used as a main component.

As illustrated in FIG. 1, the electrode layer 3 has a plurality of strip electrodes 31. In the present disclosure, the strip electrodes 31 refer to one of a group of narrow electrodes extending parallel to the D2 axis. The plurality of strip electrodes 31 extend parallel to each other. The number of the plurality of strip electrodes 31 may be appropriately set in accordance with the electrical characteristics required for the elastic wave device 1. The number may be larger or smaller than the number illustrated in the schematic cross-sectional views and plan views according to the present disclosure.

Among the plurality of strip electrodes 31, at least some strip electrodes 31 are each an excitation portion 311 that can excite an elastic wave. For example, as illustrated in FIG. 1, the excitation portion 311 may be included in an IDT electrode 35. The elastic wave can be excited by the IDT electrode 35 including the excitation portion 311 and the bus bar 351.

When the elastic wave device 1 includes the IDT electrode 35, the IDT electrode 35 includes the excitation portion 311 and the bus bar 351. Here, the bus bar 351 refers to a portion that electrically connects the strip electrode 31 which is the excitation portion 311. The IDT electrode 35 include, as the bus bar 351, a first bus bar 351a and a second bus bar 351b that are opposed to each other and are not electrically connected to each other. The excitation portion 311 includes the first excitation portion 311a extending from the first bus bar 351a toward the second bus bar 351b, and a second excitation portion 311b extending from the second bus bar 351b toward the first bus bar 351a.

The lengths of the excitation portions 311 are, for example, equal to each other. The IDT electrode 35 may be subjected to so-called apodization in which the length of the excitation portion 311 varies depending on the position in the propagation direction. The apodization can make the elastic wave propagating as the main resonance more dominant.

Although not particularly illustrated, the IDT electrode 35 may include a dummy electrode finger extending from the bus bar 351 toward the opposing bus bar 351. The dummy electrode fingers may be shorter than the excitation portion 311 in the D2 axis. The IDT electrodes 35 may have different widths between the excitation portions 311, or may be inclined with respect to the D1 axis.

The plurality of strip electrodes 31 include a first strip electrode 315 located closest to the end surface 41 in the elastic wave propagation direction, and a second strip electrode 3117 farther from the end surface than the first strip electrode 315. Here, the second strip electrode 3117 is the excitation portion 311. The second strip electrode 3117 may be any of the excitation portions 311 that excite the main resonance of the elastic wave device 1.

In the elastic wave device 1, the average thickness of the excitation portion 311 in a cross section taken along the elastic wave propagation direction is adjusted as appropriate to contribute to the propagation of the elastic wave in the positive direction of the D1 axis. In other words, the average thickness of the excitation portion 311 may determine the average thickness for propagation of the elastic wave. In the present disclosure, unless otherwise specified, the term "average thickness" refers to the thickness in a cross section taken in the elastic wave propagation direction. In the present disclosure, the average thickness of the strip electrodes 31 may be obtained by dividing the cross-sectional area of the strip electrodes 31 by the lower side of the strip electrodes 31 in a cross section obtained by cutting the elastic wave device 1 along the D1 axis, or may be obtained by various other methods.

In the elastic wave device 1 according to the first embodiment, the average thickness of the first strip electrode 315 is smaller than the average thickness of the second strip electrode 3117. As a result, the behavior of the propagating elastic wave changes between the second strip electrode 3117, which is the excitation portion 311, and the first strip electrode 315. A portion of the elastic wave energy that becomes spurious emission in the vicinity of the first strip electrode 315 can be leaked downward.

The elastic wave device 1 uses reflected waves reflected by the end surface 41. The spurious emission of the elastic wave device 1 can be reduced by causing a portion of the elastic wave energy that becomes spurious emission of the reflected wave to leak downward in the vicinity of the end surface 41 where the reflected wave is generated.

The average thickness of the first strip electrode 315 may be appropriately sized to adjust specific characteristics. As described above, since the average thickness of the first strip electrode 315 is small, a portion of the elastic wave that becomes spurious emission leaks downward, and the spurious emission of the elastic wave device 1 can be reduced. On the other hand, the first strip electrode 315 leaks a portion of the elastic wave that is the main resonance, and increases the loss of the elastic wave device 1. For example, the average thickness of the first strip electrode 315 may be adjusted so as to balance loss and spurious emission of the elastic wave device 1. For example, the adjustment may be performed such that the loss and the spurious emission are reduced.

The average thickness of the majority of the strip electrodes 31 that are the excitation portions 311 is the same as that of the second strip electrode 3117. An elastic wave excited as a main resonance of the elastic wave device 1 can be more dominant. In the present disclosure, the average thickness being "identical to" may include an error within a range that does not significantly affect specific characteristics of the elastic wave device 1. In the present disclosure, "the majority of the strip electrodes 31 that are the excitation portions 311" refers to the majority of the strip electrodes 31 that are the excitation portions 311 including the second strip electrodes 3117. For example, the average thickness of the strip electrodes 31 that are the excitation portions 311 may be obtained, and the number of the strip electrodes 31 having the same average thickness as that of the second strip electrodes 3117 may be counted.

The first strip electrode 315 may be partially reduced in thickness. For example, the side surface of the first strip electrode 315 may be inclined downward. That is, the first angle formed by the upper surface and the side surface of the first strip electrode 315 may be an obtuse angle. In this case, since the thickness of the inclined portion is reduced, the average thickness of the first strip electrode 315 can be reduced. When the side surface located on the end surface 41 side among the side surfaces of the first strip electrode 315 is inclined downward, a portion of the elastic wave that becomes spurious emission propagates through the inclined side surface, and thus, the spurious emission of the elastic wave device 1 can be further reduced. When the first angle is an obtuse angle and is larger than the second angle formed by the upper surface and the side surface of the second strip electrode 3117, for example, the average thickness of the first strip electrode 315 can be made smaller than the average thickness of the second strip electrode 3117. With the above-described shape, when the thickness of a portion of the first strip electrode 315 is small, spurious emission can be further reduced. In this case, for example, it is easy to adjust the balance between the loss and the spurious emission.

Figure 3A:
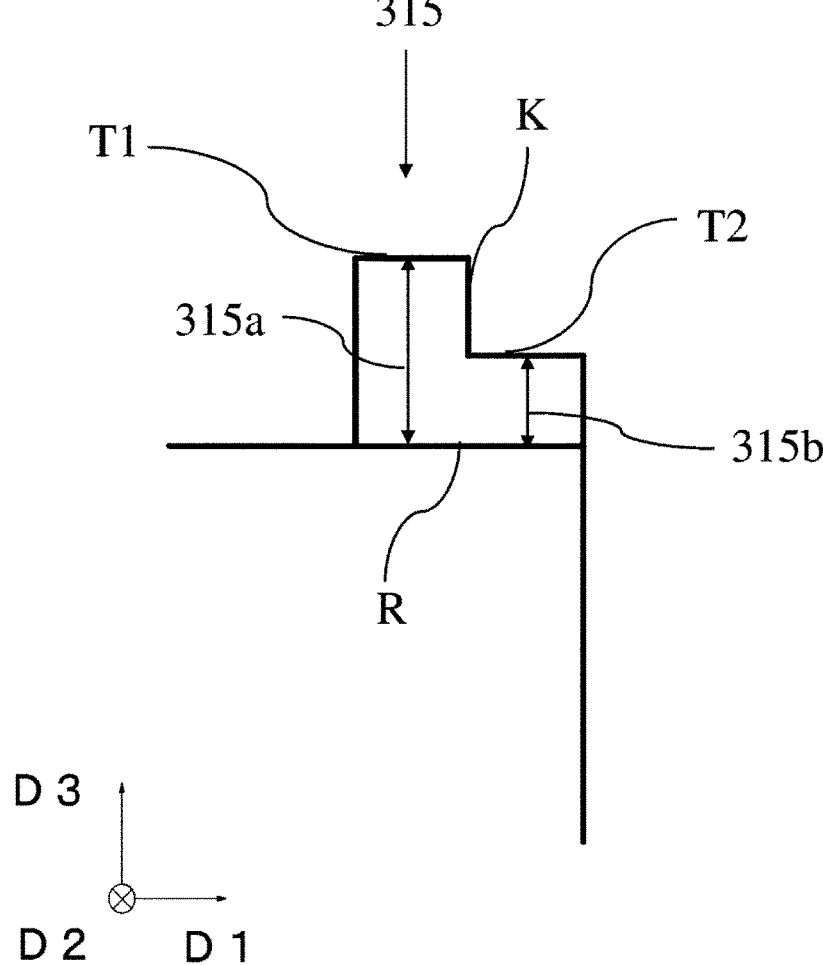
FIG. 3A is a schematic cross-sectional view of the elastic wave device according to an embodiment of the present disclosure.
Figure 3B:
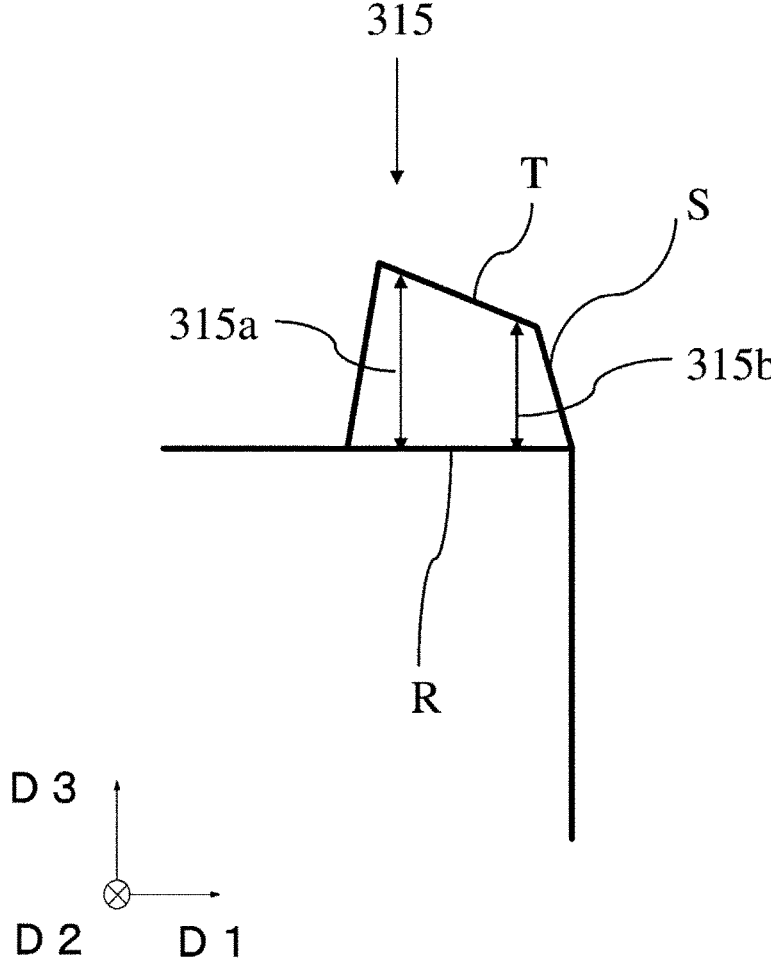
FIG. 3B is a schematic cross-sectional view of the elastic wave device according to an embodiment of the present disclosure.
Figure 3C:
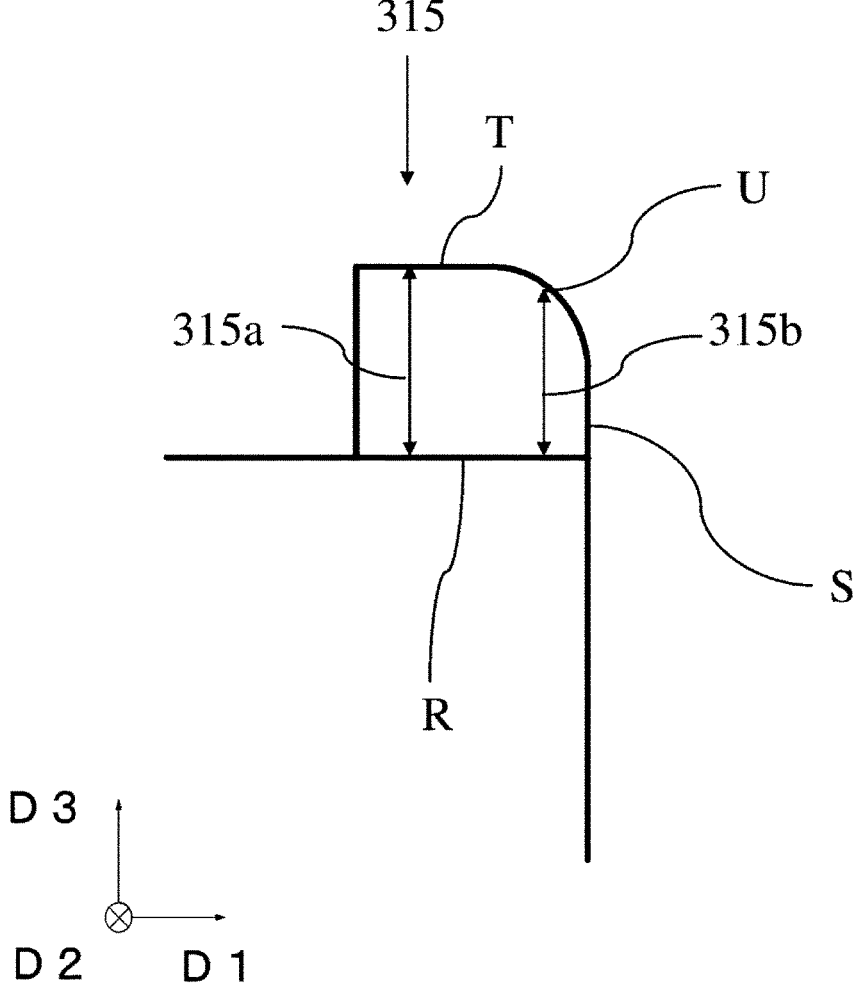
FIG. 3C is a schematic cross-sectional view of the elastic wave device according to an embodiment of the present disclosure.

As illustrated in FIGS. 3A to 3C, the first strip electrode 315 may be partially thinned on the end surface 41 side. In other words, the first strip electrode 315 includes a first portion 315a and a second portion 315b having a smaller thickness than the first portion 315a in a cross section taken along the elastic wave propagation direction, and the second portion 315b is located closer to the end surface 41 than the first portion 315a in the elastic wave propagation direction.

As illustrated in FIG. 3A, the first strip electrode 315 may be stepped in the negative direction of the D2 axis. In other words, the first strip electrode 315 may include a lower surface R, a first upper surface T1, a second upper surface T2 located closer to the end surface 41 than the first upper surface T1 in the elastic wave propagation direction, and a rising surface K connecting the first upper surface T1 and the second upper surface T2, and the first upper surface T1 may be located above the second upper surface T2. In this case, a portion of the elastic wave that becomes spurious emission propagates through the second upper surface T2 located on the lower side, and is likely to leak downward. As a result, spurious emission of the elastic wave device 1 can be further reduced.

It may be trapezoidal in shape as illustrated in FIG. 3B, and the upper surface may be inclined. In other words, the first strip electrode 315 includes a lower surface R, a first surface S located on the end surface 41 side among the side surfaces in contact with the lower surface R in the elastic wave propagation direction, and an upper surface T in contact with the first surface S, and the upper surface T may be inclined with respect to the lower surface R. In this case, a portion of the elastic wave that becomes spurious emission is leaked downward along the inclined upper surface T. As a result, spurious emission of the elastic wave device 1 can be further reduced.

As illustrated in FIG. 3C, the apex portion on the end surface 41 side may be curved. In other words, the first strip electrode 315 may include the lower surface R, the first surface S located on the end surface 41 side among side surfaces in contact with the lower surface R in the elastic wave propagation direction, the upper surface T in contact with the first surface S, and a second surface U connecting the first surface S and the upper surface T, and the second surface U may have a curved shape. In this case, a portion of the elastic wave that becomes spurious emission is leaked downward along the second surface U, which is a curved surface. As a result, spurious emission of the elastic wave device 1 can be reduced.

Figure 4A:
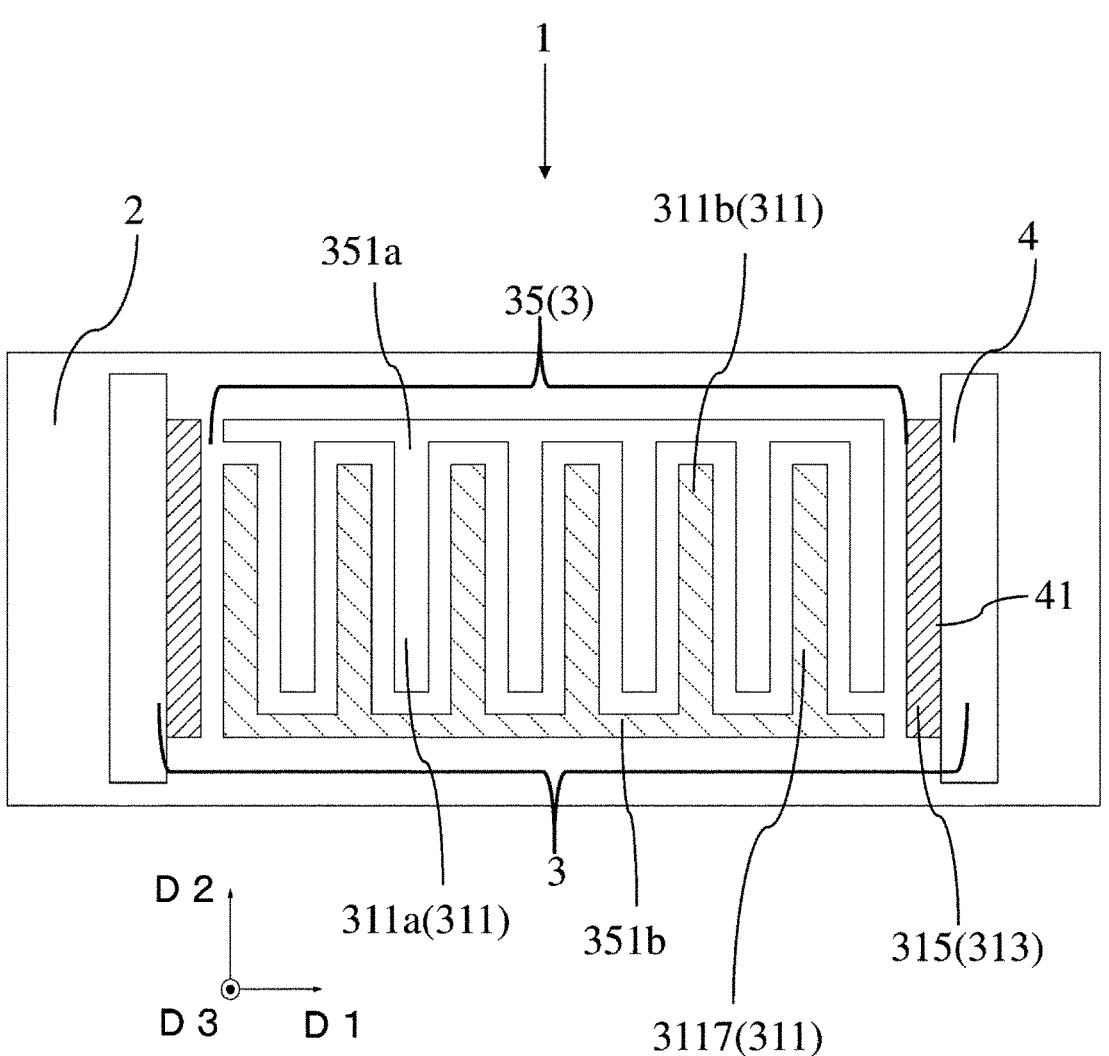
FIG. 4A is a schematic plan view of the elastic wave device according to an embodiment of the present disclosure.

As illustrated in FIG. 4A, the first strip electrode 315 may be a floating electrode 313 that is not electrically connected to the excitation portion 311. The influence of the first strip electrode 315 having a small average thickness on the excitation of the elastic wave of the excitation portion 311 can be reduced. The acoustic velocity of the excited elastic wave and/or the reflected wave can be adjusted by the floating electrode 313.

Figure 4B:
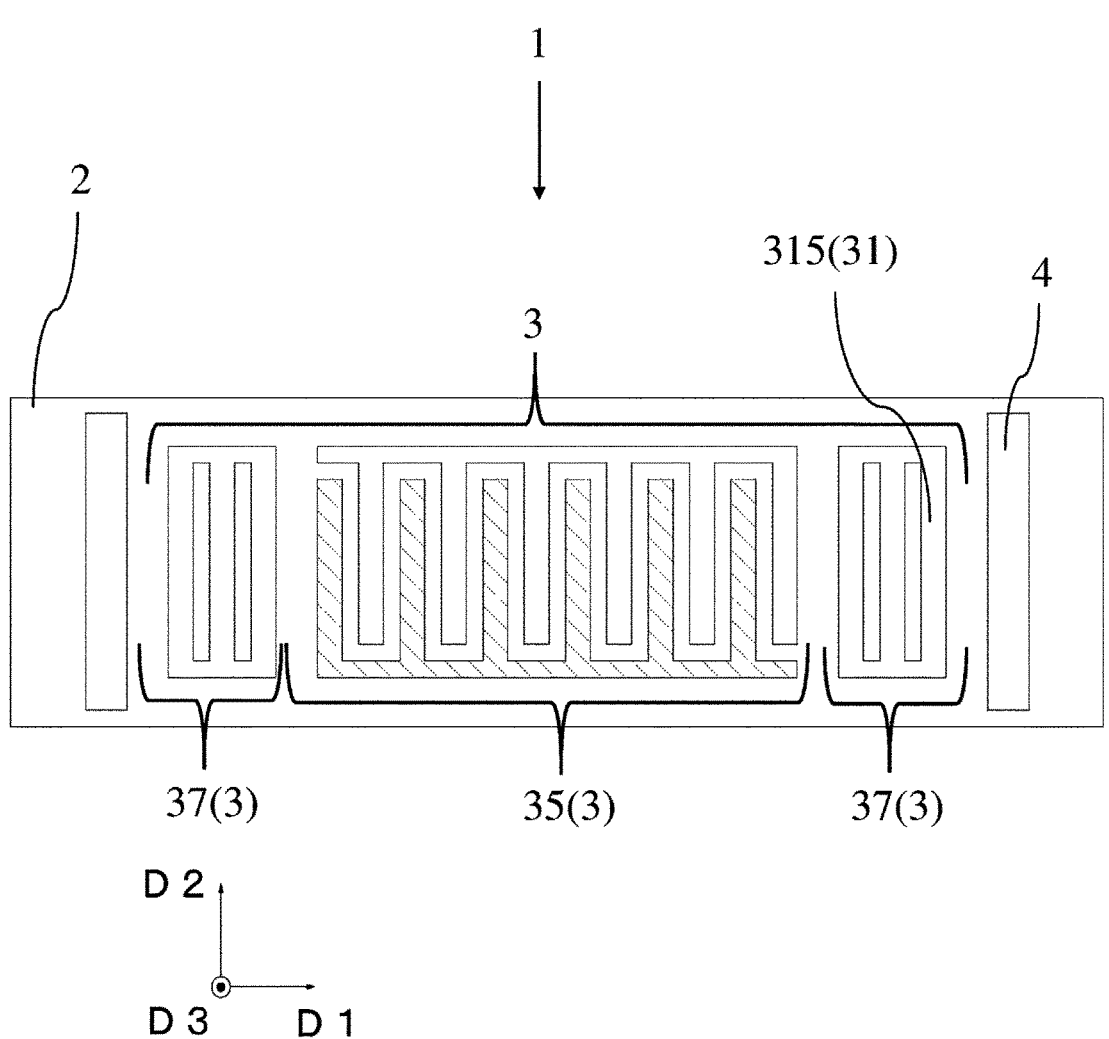
FIG. 4B is a schematic plan view of the elastic wave device according to an embodiment of the present disclosure.

As illustrated in FIG. 4B, the electrode layer 3 may have a reflector 37. In this case, the first strip electrode 315 refers to the strip electrode 31 located closest to the end surface 41 in the elastic wave propagation direction among the strip electrodes 31 included in the reflector 37.

The side surface of the first strip electrode 315 and the end surface 41 do not necessarily need to be continuous, but the side surface of the first strip electrode 315 may be continuous with the end surface 41 as illustrated in FIG. 1. In this case, the first strip electrode 315 and the end surface 41 can be formed by one etching step.

Figure 5:
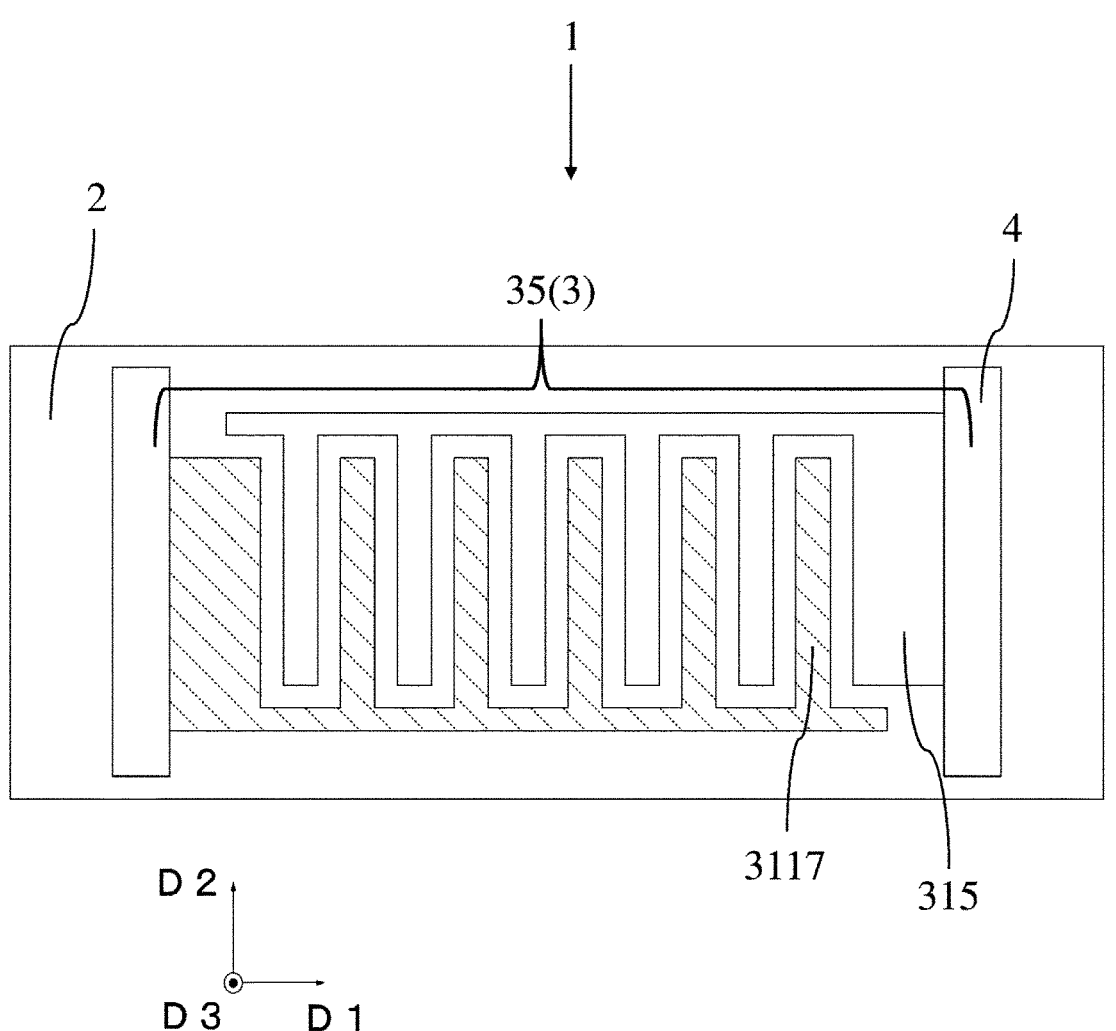
FIG. 5 is a schematic plan view of the elastic wave device according to an embodiment of the present disclosure.

The width of the first strip electrode 315 in the D1 axis may be different from the width of the other strip electrodes 31. In this case, the mode of the reflected wave can be adjusted so as to reduce the spurious emission of the elastic wave device 1. For example, as illustrated in FIG. 5, the width of the first strip electrode 315 in the elastic wave propagation direction may be larger than that of the second strip electrode 3117. In this case, in the manufacturing method described below, the possibility that the second strip electrode 3117 is etched is reduced.

Second Embodiment

A second embodiment according to the present disclosure will be described. In the following, the description of the parts common to the first embodiment will be omitted, and only the different parts will be described.

End Surface

In the elastic wave device 1 according to the second embodiment, the end surface 41 is inclined as illustrated in FIG. 2. In other words, an angle $\alpha$ formed by an extended line of the upper surface of the piezoelectric body 21 and a tangential line at any point on the end surface 41 is smaller than 90°. Since the end surface 41 is inclined, a portion of the elastic wave that becomes spurious emission leaks downward, and the spurious emission of the elastic wave device 1 can be reduced.

In the present disclosure, in a case where an angle formed by a "tangential line" is obtained, any point on a straight line is obtained using the straight line as the "tangential line". The description "tangential line at any point on the end surface" does not limit that the end surface is a curved surface or a curved line.

The angle $\alpha$ may be appropriately sized to adjust specific characteristics. As described above, since the end surface 41 is inclined, a portion of the elastic wave that becomes spurious emission leaks downward, and the spurious emission of the elastic wave device 1 can be reduced. On the other hand, the end surface 41 leaks a portion of the elastic wave that is the main resonance, and increases the loss of the elastic wave device 1. For example, the angle $\alpha$ may be adjusted so as to balance the loss and spurious emission of the elastic wave device 1. For example, the adjustment may be performed such that the loss and the spurious emission are reduced. Since the elastic wave device 1 according to the second embodiment includes the first strip electrode 315 and the end surface 41 as a structure that reduces spurious emission, it is easy to adjust the balance between loss and spurious emission.

When the end surface 41 is inclined, the distances of the D1 axis from the IDT electrode 35 to the end surface 41 vary depending on the coordinates of the D2 axis. As a result, since spurious emission is likely to occur due to the reflection of the elastic wave by the end surface 41, the spurious emission can be further reduced by the first strip electrode 315 that leaks the elastic wave energy near the end surface 41. For example, when the angle $\alpha$ is smaller than 82°, spurious emission is particularly likely to occur in the vicinity of the end surface 41, and thus spurious emission can be further reduced by the first strip electrode 315.

Third Embodiment

A third embodiment according to the present disclosure will be described. In the following, the description of the parts common to the first embodiment will be omitted, and only the different parts will be described.

End Surface

Figure 6:
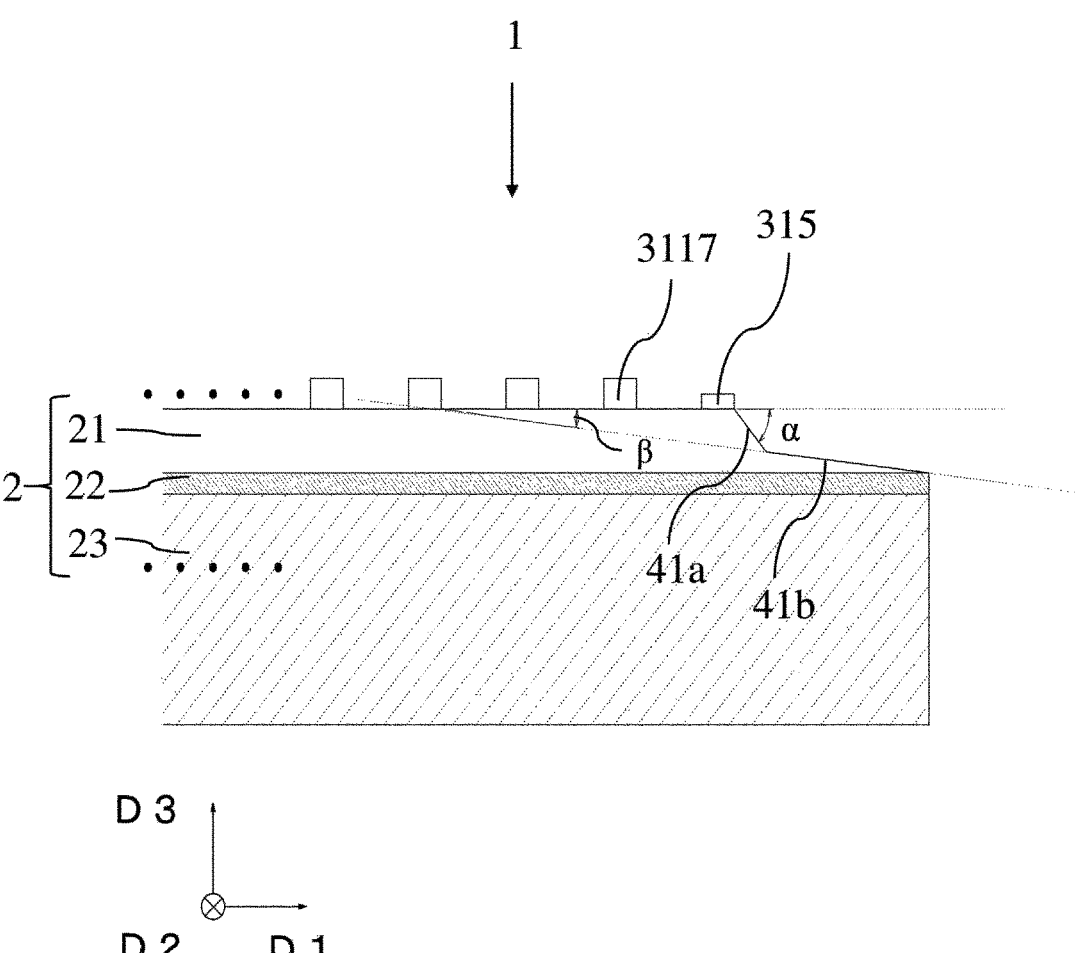
FIG. 6 is a schematic cross-sectional view of the elastic wave device according to an embodiment of the present disclosure.

As illustrated in FIG. 6, the end surface 41 includes a first end surface 41a and a second end surface 41b. The first end surface 41a is located on the upper surface side of the piezoelectric body 21, and the second end surface 41b is located on the lower surface side of the piezoelectric body 21. As illustrated in FIG. 6, the first end surface 41a is inclined more steeply than the second end surface 41*b*. In other words, the angle α formed by the extended line of the upper surface of the piezoelectric body 21 and the tangential line at any point on the first end surface 41*a* is larger than the angle β formed by the extended line of the upper surface of the piezoelectric body 21 and the tangential line at any point on the second end surface 41*b*.

In the elastic wave device 1 according to the second embodiment, the upper surface side of the piezoelectric body 21 through which the elastic wave defining and functioning as the main resonance propagates is steep, and the elastic wave to be used is further reflected by the first end surface 41*a*, thus contributing to a reduction in loss.

In addition, since the end surface 41 has the first end surface 41*a* and the second end surface 41*b* having different inclination angles, it is easy to adjust specific characteristics by the end surface 41 by adjusting the respective inclination angles. For example, it is easy to balance the loss and the spurious emission.

Manufacturing Method

A method of manufacturing the elastic wave device 1 according to the present disclosure will be described. FIG. 7 illustrates a manufacturing step, and the step proceeds in the order of A, B, C, and D.

The elastic wave device 1 is manufactured by layering the substrate 2 and the electrode layer 3 in this order. Thereafter, the plurality of strip electrodes 31 are formed above the substrate 2.

Figure 7A:
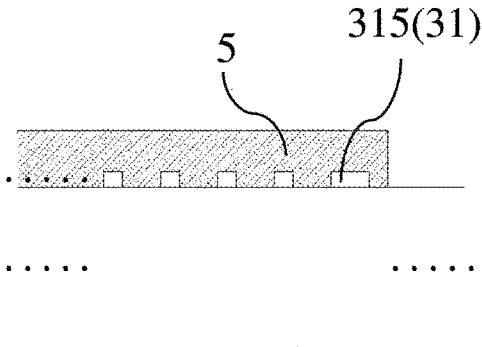
FIGS. 7A-D are schematic cross-sectional views illustrating a manufacturing method of an elastic wave device according to an embodiment of the present disclosure.

In the elastic wave device 1, a mask 5 is formed above the strip electrodes 31 as illustrated in FIG. 7A, and etching is performed. The end surface 41 can be formed on the piezoelectric body 21 by etching.

In the elastic wave device 1, the mask 5 is formed above the strip electrodes 31 as illustrated in FIG. 7A, and etching is performed. The strip electrode 31 may be thinned by etching to form the first strip electrode 315.

The end surface 41 and the first strip electrode 315 may be formed separately by performing etching a plurality of times, or may be formed simultaneously or continuously by performing etching once.

Figure 7B:
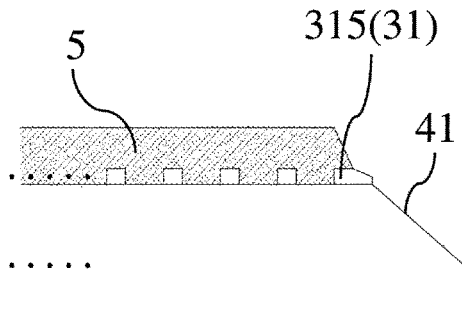

When both the end surface 41 and the first strip electrodes 315 are formed by etching, by appropriately adjusting the material and thickness of the mask 5, the conditions of plasma generation in dry etching, or various conditions, the mask 5 gradually recedes from the positive direction to the negative direction of the D1 axis by etching as illustrated in FIG. 7B at the time of forming the end surface 41, and the end surface 41 side of the first strip electrodes 315 is exposed. Since the first strip electrode 315 is naturally exposed from the end surface 41 side, the mask 5 can be formed so that only the first strip electrode 315 has a small average thickness. For example, the mask 5 can be formed such that the second portion 315*b* is located in the elastic wave propagation direction with respect to the first portion 315*a*.

Figure 7C:
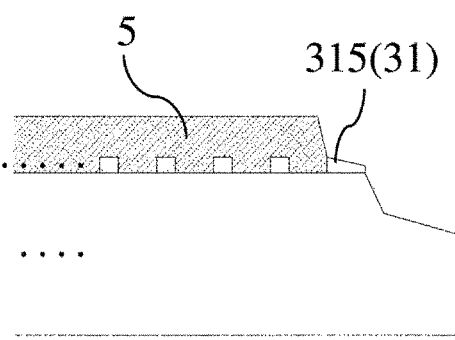
Figure 7D:
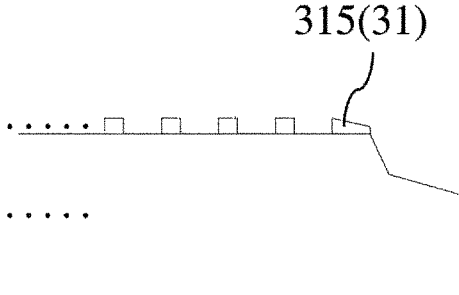

As compared with a case in which the end surface 41 and the first strip electrode 315 are separately etched, difficulty in accurately forming the mask 5 is avoided, and the elastic wave device 1 is easily manufactured. The first strip electrodes 315 are formed by the retreated mask 5 as illustrated in FIG. 7C. Finally, the mask 5 is removed as illustrated in FIG. 7D, so that the elastic wave device 1 can be manufactured.

When both the end surface 41 and the first strip electrode 315 are etched, the etching may be performed after removing a portion of the mask 5 located above the first strip electrode 315. A portion of the first strip electrode 315 is likely to be exposed.

After a portion of the first strip electrode 315 is exposed, the first strip electrode 315 serves as a metallic mask as illustrated in FIG. 7B. Since a metal mask is less likely to be etched than a resin mask, the end surface 41 can be formed steeply. In other words, the first end surface 41*a* formed after the portion of the first strip electrode 315 is exposed is steeper than the second end surface 41*b* formed before the portion of the first strip electrode 315 is exposed. The elastic wave device 1 according to the third embodiment can be manufactured. For example, in the case where the electrode layer 3 containing Ti as a main component is used, the etching selection ratio of LT to Ti is higher than the etching selection ratio of LT to Al, and thus the electrode layer 3 is likely to function as a metal mask. As a result, the first end surface 41*a* can be made steeper.

The etching may be performed by dry etching.

As the mask 5, for example, a resist for i-line may be used. Alternatively, a positive resist may be used. A novolac resin may be used.

First Usage Example: Branching Filter

Figure 8:
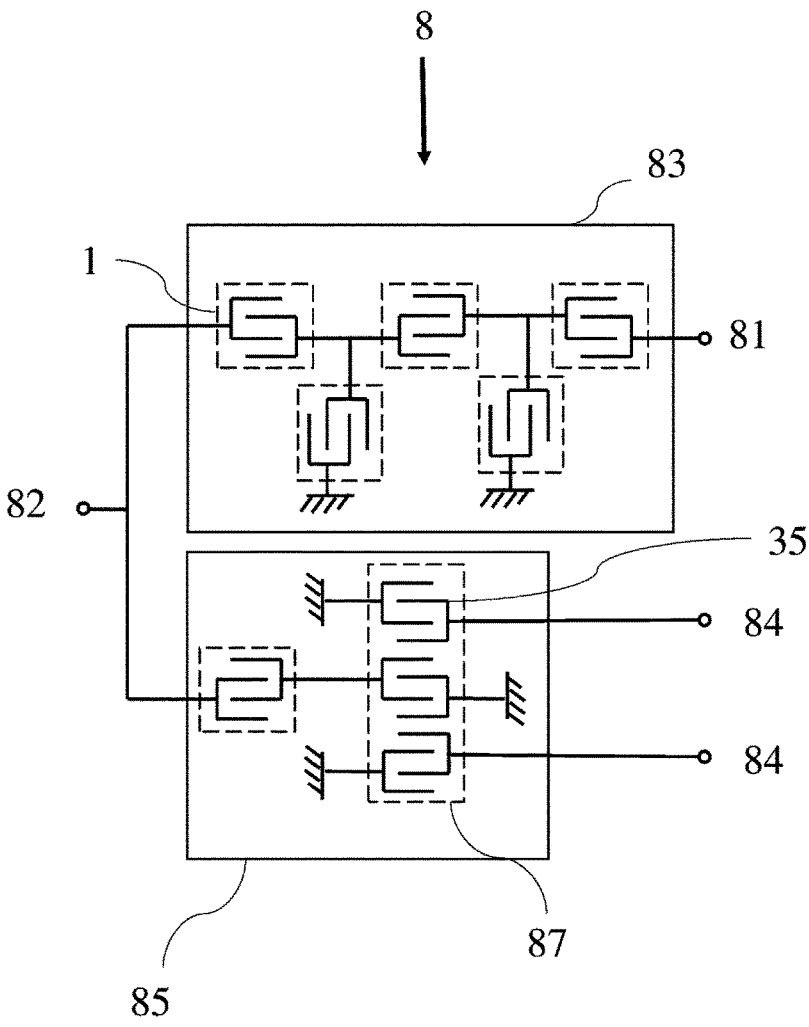
FIG. 8 is a schematic circuit diagram of a branching filter according to an embodiment of the present disclosure.

FIG. 8 is a circuit diagram schematically illustrating a configuration of a branching filter 8 as a usage example of the elastic wave device 1.

The branching filter 8 includes, for example, a transmission filter 83 that filters a transmission signal from a transmission terminal 81 and outputs the filtered signal to an antenna terminal 82, and a reception filter 85 that filters a reception signal from the antenna terminal 82 and outputs the filtered signal to a pair of reception terminals 84.

The transmission filter 83 includes, for example, a ladder filter including a plurality of elastic wave devices 1. That is, the transmission filter 83 includes a plurality of (or one) elastic wave devices 1 connected in series between the transmission terminal 81 and the antenna terminal 82, and a plurality of (or one) elastic wave devices 1 (parallel arms) connecting the series line (series arm) and the reference potential.

The reception filter 85 includes, for example, the elastic wave device 1 and a multi-mode filter (including a double-mode filter) 87. The multi-mode type filter 87 includes a plurality of (three in the illustrated example) IDT electrodes 35 arranged in the arrangement direction of the plurality of strip electrodes 31.

Although the case where the branching filter 8 includes the transmission filter 83 and the reception filter 85 has been described, the present disclosure is not limited thereto. The branching filter 8 may be, for example, a diplexer or a multiplexer including three or more filters.

Second Usage Example: Communication Device

Figure 9:
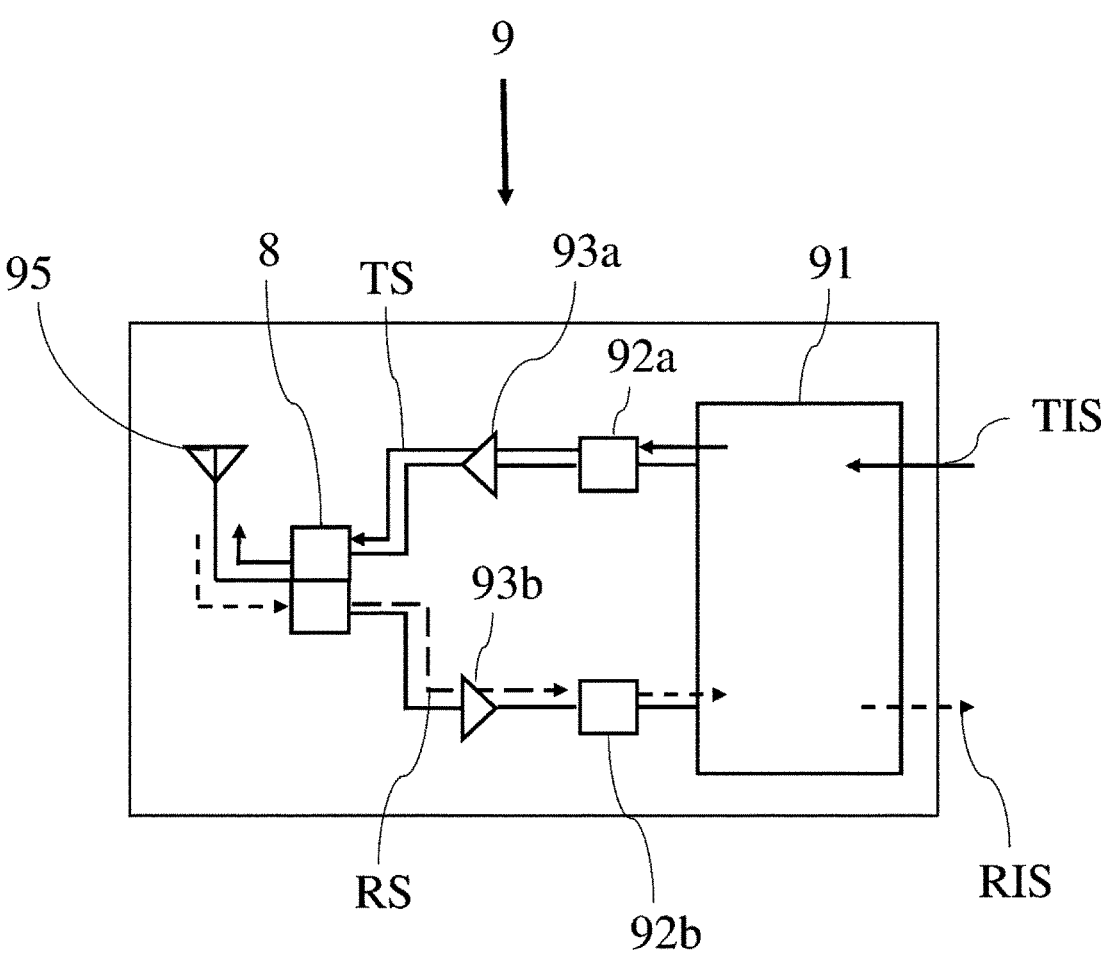
FIG. 9 is a schematic circuit diagram of a communication device according to an embodiment of the present disclosure.

FIG. 9 is a block diagram illustrating a main part of a communication device 9 as a usage example of the branching filter 8. The communication device 9 performs wireless communication using radio waves, and includes a branching filter 8.

In the communication device 9, a transmission information signal TIS including information to be transmitted is modulated and raised in frequency (converted into a high-frequency signal of a carrier frequency) by an RF-IC (Radio Frequency Integrated Circuit) 91 to be a transmission signal TS. Unnecessary components of the transmission signal TS other than the transmission pass band are removed by a band pass filter 92*a*, and the transmission signal TS is amplified by an amplifier 93*a* and input to the branching filter 8 (transmission terminal 81). Then, the branching filter 8 (transmission filter 83) removes unnecessary components other than the transmission passband from the input transmission signal TS, and outputs the transmission signal TS after the removal to the antenna terminal 82 or the antenna 95. The antenna 95 converts the input electric signal (transmission signal TS) into a radio signal (radio wave) and transmits the radio signal.

In the communication device 9, a radio signal (radio wave) received by the antenna 95 is converted into an electric signal (reception signal RS) by the antenna 95 and input to the branching filter 8 (antenna terminal 82). The branching filter 8 (reception filter 85) removes unnecessary components other than the reception passband from the input reception signal RS, and the reception signal RS is amplified by an amplifier 93*b* from the reception terminal 84, and the unnecessary components other than the reception passband are removed by a band-pass filter 92*b*. Then, the reception signal RS is lowered in frequency and demodulated by the RF IC 91 to become a reception information signal RIS.

The transmission information signal TIS and the reception information signal RIS may be low frequency signals (baseband signals) including appropriate information, and are, for example, analog audio signals or digitized audio signals. Radio signal passbands (e.g., 5 GHz and above) are also possible. The modulation scheme may be any of phase modulation, amplitude modulation, frequency modulation, or a combination of any two or more thereof. Although a direct conversion method is illustrated as the circuit method in FIG. 9, other appropriate methods may be used, and for example, a double superheterodyne method may be used. FIG. 9 schematically illustrates only a main part, and a low-pass filter, an isolator, or the like may be added at an appropriate position, or a position of an amplifier or the like may be changed.

CONCLUSION (1) In a first aspect of the present disclosure, an elastic wave device includes a substrate having an end surface and including a piezoelectric body, and a plurality of strip electrodes located above the substrate, each of the plurality of strip electrodes extending in parallel. At least some strip electrodes among the plurality of strip electrodes are excitation portions that can excite an elastic wave. In a plan view from above, the end surface is parallel to a direction in which the plurality of strip electrodes extend, and located in an elastic wave propagation direction with respect to the excitation portion. The plurality of strip electrodes include a first strip electrode located closest to the end surface in the elastic wave propagation direction, and a second strip electrode farther from the end surface than the first strip electrode in the elastic wave propagation direction. The second strip electrode is the excitation portion. An average thickness of the first strip electrode is smaller than an average thickness of the second strip electrode, in a cross section cut in the elastic wave propagation direction.

(2) In an elastic wave device according to a second aspect of the present disclosure, in the first aspect, the first strip electrode may include a first portion and a second portion having a thickness smaller than a thickness of the first portion in a cross-section cut in the elastic wave propagation direction. The second portion may be located closer to the end surface than the first portion in the elastic wave propagation direction.

(3) In an elastic wave device according to a third aspect of the present disclosure, in the first or second aspect, the first strip electrode may have a lower surface, a first upper surface, a second upper surface located closer to the end surface than the first upper surface in the elastic wave propagation direction, and a rising surface connecting the first upper surface and the second upper surface. The first upper surface may be located above the second upper surface.

(4) In an elastic wave device according to a fourth aspect of the present disclosure, in the first to third aspects, the first strip electrode may have a lower surface, a first surface located on a side of the end surface among side surfaces in contact with the lower surface in the elastic wave propagation direction, and an upper surface in contact with the first surface. The upper surface may be inclined downward with respect to the lower surface.

(5) In an elastic wave device according to a fifth aspect of the present disclosure, in the first to fourth aspects, the first strip electrode may have a lower surface, a first surface located on a side of the end surface among side surfaces in contact with the lower surface in the elastic wave propagation direction, an upper surface in contact with the first surface, and a second surface connecting the first surface and the upper surface. The second surface may have a curved surface.

(6) In an elastic wave device according to a sixth aspect of the present disclosure, in the first to fifth aspects, a majority of average thicknesses of the strip electrodes serving as the excitation portion are identical to an average thickness of the second strip electrode.

(7) In an elastic wave device according to a seventh aspect of the present disclosure, in the first to sixth aspects, in a cross section cut in the elastic wave propagation direction, an angle α formed by an extended line of the upper surface of the piezoelectric body and a tangential line at any point on the end surface may be smaller than 90°.

(8) In an elastic wave device according to an eighth aspect of the present disclosure, in the first to seventh aspects, the angle α may be smaller than 82°.

(9) In an elastic wave device according to a ninth aspect of the present disclosure, in the first to eighth aspects, the end surface may have a first end surface located on an upper surface side of the piezoelectric body and a second end surface located on a lower surface side of the piezoelectric body. In a cross section cut in the elastic wave propagation direction, an angle formed by the extended line of the upper surface of the piezoelectric body and a tangential line at any point on the first end surface may be larger than an angle formed by the extended line of the upper surface of the piezoelectric body and a tangential line at any point on the second end surface.

(10) In an elastic wave device according to a tenth aspect of the present disclosure, in the first to ninth aspects, the first strip electrode may be the excitation portion.

(11) In an elastic wave device according to an eleventh aspect of the present disclosure, in the first to tenth aspects, the first strip electrode may be a floating electrode that is not electrically connected to the excitation portion.

(12) In an elastic wave device according to a twelfth aspect of the present disclosure, in the first to eleventh aspects, the first strip electrode may have a greater width in the elastic wave propagation direction than a width of the second strip electrode in the elastic wave propagation direction.

(13) In an elastic wave device according to a thirteenth aspect of the present disclosure, in the first to twelfth aspects, the first strip electrode may contain Al as a main component.

(14) In an elastic wave device according to a fourteenth aspect of the present disclosure, in the first to thirteenth aspects, the substrate may include a groove portion in an upper surface thereof, and the end surface may be a side surface of the groove portion.

(15) In an elastic wave device according to a fifteenth aspect of the present disclosure, in the first to fourteenth aspects, the substrate may include a support substrate, and a first layer located between the support substrate and the piezoelectric body.

(16) In a sixteenth aspect of the present disclosure, a method for manufacturing the elastic wave device in the first to fifteenth aspects includes a first step of forming a plurality of strip electrodes above a substrate. After the first step, the method includes a second step of forming a mask above the plurality of strip electrodes. After the second step, the method includes a third step of forming an end surface on the substrate by etching, and removing a portion of a first strip electrode located closest to the end surface in the elastic wave propagation direction among the plurality of strip electrodes by the etching.

(17) In a method for manufacturing an elastic wave device according to a seventeenth aspect of the present disclosure, in the sixteenth aspect, the second step may be performed after removing a portion of the mask located above the first strip electrode.

(18) In a method for manufacturing an elastic wave device according to an eighteenth aspect of the present disclosure, in the seventeenth aspect, in the third step, the mask may gradually retract in a direction opposite to the elastic wave propagation direction.

(19) In a nineteenth aspect of the present disclosure, a branching filter may include an antenna terminal, a transmission filter configured to filter a transmission signal and output the filtered transmission signal to the antenna terminal, and a reception filter configured to filter a reception signal from the antenna terminal. The transmission filter and/or the reception filter may include the elastic wave device according to any one of the first to fifteenth aspects.

(20) In a twentieth aspect of the present disclosure, a communication device may include an antenna, the branching filter of the nineteenth aspect including the antenna terminal connected to the antenna, and an IC connected to the transmission filter and the reception filter.

SUPPLEMENTARY NOTE

The invention according to the present disclosure has been described above based on the drawings and examples. However, the invention according to the present disclosure is not limited to each embodiment described above. That is, the embodiments of the invention according to the present disclosure can be modified in various ways within the scope illustrated in the present disclosure, and embodiments obtained by appropriately combining the technical means disclosed in different embodiments are also included in the technical scope of the invention according to the present disclosure. In other words, note that a person skilled in the art can easily make different variations or modifications based on the present disclosure. Note that these variations or modifications are included within the scope of the present disclosure.

REFERENCE SIGNS

1: Elastic wave device
2: Substrate
21: Piezoelectric body
22: First layer
23: Support substrate
3: Electrode layer
31: Strip electrode
311: Excitation portion
311a: First excitation portion
311b: Second excitation portion
3117: Second strip electrode
313: Floating electrode
315: First strip electrode
35 IDT electrode
351: Bus bar
351a: First bus bar
351b: Second bus bar
37: Reflector
4: Groove portion
41: End surface
41a: First end surface
41b: Second end surface
5: Mask
8: Branching filter
9: Communication device

The invention claimed is:

1. An elastic wave device comprising:
a substrate comprising a piezoelectric body;
a groove portion comprising an end surface of the piezoelectric body, the groove portion located on the substrate; and
a plurality of strip electrodes located above the substrate, each of the plurality of strip electrodes extending in parallel, wherein at least some of the plurality of strip electrodes form an excitation portion configured to excite an elastic wave,
wherein the end surface, in a plan view from above is:
parallel to the extending direction of the plurality of strip electrodes, and
is located in an elastic wave propagation direction relative to the excitation portion,
wherein, in the elastic wave propagation direction, the plurality of strip electrodes comprise:
a first strip electrode located closest to the end surface, and
a second strip electrode located farther from the end surface than the first strip electrode, the second strip electrode forming the excitation portion,
wherein, in a cross section taken along the elastic wave propagation direction,
an average thickness of the first strip electrode is smaller than an average thickness of the second strip electrode.
2. The elastic wave device according to claim 1, wherein the first strip electrode comprises:
a first portion; and
a second portion having a thickness smaller than a thickness of the first portion in the cross section, and the second portion is located closer to the end surface of the groove portion than the first portion in the elastic wave propagation direction.

3. The elastic wave device according to claim 1, wherein, in the first strip electrode, a side surface located on a side of the end surface of the groove portion is inclined downward in the elastic wave propagation direction.

4. The elastic wave device according to claim 1, wherein the first strip electrode has:

a lower surface;

a first upper surface;

a second upper surface located closer to the end surface of the groove portion than the first upper surface in the elastic wave propagation direction; and a rising surface connecting the first upper surface and the second upper surface, and the first upper surface is located above the second upper surface.

5. The elastic wave device according to claim 1, wherein the first strip electrode has:

a lower surface;

a first surface located on a side of the end surface of the groove portion among side surfaces and forming a predetermined angle with the lower surface in the elastic wave propagation direction; and an upper surface in contact with the first surface, and the upper surface is inclined downward with respect to the lower surface.

6. The elastic wave device according to claim 1, wherein the first strip electrode has:

a lower surface;

a first surface located on a side of the end surface of the groove portion among side surfaces and forming a predetermined angle with the lower surface in the elastic wave propagation direction;

an upper surface in contact with the first surface;

a second surface connecting the first surface and the upper surface, and the second surface has a curved shape.

7. The elastic wave device according to claim 1, wherein a majority of average thicknesses of strip electrodes serving as the excitation portion among the plurality of strip electrodes are identical to an average thickness of the second strip electrode.

8. The elastic wave device according to claim 1, wherein in the cross section, an angle α formed by an extended line of the end surface of the groove portion and a tangential line at any point on the end surface is smaller than 90°.

9. The elastic wave device according to claim 8, wherein the end surface has:

a first end surface located on an upper surface side of the piezoelectric body; and a second end surface located on a lower surface side of the piezoelectric body, and in the cross section, an angle formed by the extended line of the end surface of the groove portion and a tangential line at any point on the second end surface is smaller than 90°.

10. The elastic wave device according to claim 1, wherein the first strip electrode is the excitation portion.

11. The elastic wave device according to claim 1, wherein the first strip electrode is a floating electrode that is not electrically connected to the excitation portion.

12. The elastic wave device according to claim 1, wherein the first strip electrode has a width in the elastic wave propagation direction larger than a width of the second strip electrode in the elastic wave propagation direction.

13. The elastic wave device according to claim 1, wherein the substrate comprises;

a support substrate; and a first layer located between the support substrate and the piezoelectric body.

14. A branching filter comprising:

an antenna terminal;

a transmission filter configured to filter a transmission signal and output the filtered transmission signal to the antenna terminal; and a reception filter configured to filter a reception signal from the antenna terminal, wherein the transmission filter and/or the reception filter comprises the elastic wave device according to claim 1.

15. A communication device comprising:

an antenna;

the branching filter according to claim 14, the antenna terminal of the branching filter being connected to the antenna; and an integrated circuit connected to the transmission filter and the reception filter.

16. The elastic wave device according to claim 1, wherein the end surface reflects the elastic wave toward the negative direction of the elastic wave propagation direction.

17. An elastic wave device comprising:

a substrate comprising a piezoelectric body;

a groove portion comprising an end surface of the piezo-electric body, the groove portion located on the sub-strate; and a plurality of strip electrodes located above the substrate, each of the plurality of strip electrodes extending in parallel, wherein at least some of the plurality of strip electrodes form an excitation portion configured to excite an elastic wave, wherein the end surface, in a plan view from above, is parallel to an extending direction of the plurality of strip electrodes and is located in an elastic wave propagation direction relative to the excitation portion, wherein, in the elastic wave propagation direction, the plurality of strip electrodes comprise a first strip elec-trode located closest to the end surface and a second strip electrode located farther from the end surface than the first strip electrode, the second strip electrode forming the excitation portion, wherein, in a cross section taken along the elastic wave propagation direction, an average thickness of the first strip electrode is smaller than an average thickness of the second strip electrode, and wherein the first strip electrode has a second surface that connects a side surface and an upper surface of the first strip electrode, the second surface having a curved shape.

* * * * *